(12) United States Patent
Lee et al.

(10) Patent No.: US 7,989,145 B2
(45) Date of Patent: *Aug. 2, 2011

(54) METHOD FOR FORMING FINE PATTERN OF SEMICONDUCTOR DEVICE

(75) Inventors: Ki Lyoung Lee, Hwaseong-si (KR); Cheol Kyu Bok, Icheon-si (KR)

(73) Assignee: Hynix Semiconductor Inc., Icheon-si (KR)

( * ) Notice: Subject to any disclaimer, the term of this patent is extended or adjusted under 35 U.S.C. 154(b) by 779 days.

This patent is subject to a terminal disclaimer.

(21) Appl. No.: 11/964,693

(22) Filed: Dec. 26, 2007

(65) Prior Publication Data

US 2009/0004604 A1 Jan. 1, 2009

(30) Foreign Application Priority Data

Jun. 29, 2007 (KR) .......................... 10-2007-0065126

(51) Int. Cl.
*G03F 7/26* (2006.01)
(52) U.S. Cl. ........................................ 430/313; 430/316
(58) Field of Classification Search .................. 430/311, 430/313
See application file for complete search history.

(56) References Cited

U.S. PATENT DOCUMENTS

| | | | |
|---|---|---|---|
| 5,750,680 A | 5/1998 | Kim et al. | 540/200 |
| 6,051,678 A | 4/2000 | Kim et al. | 528/323 |
| 6,132,926 A | 10/2000 | Jung et al. | 430/270.1 |
| 6,143,463 A | 11/2000 | Jung et al. | 430/270.1 |
| 6,150,069 A | 11/2000 | Jung et al. | 430/270.1 |
| 6,180,316 B1 | 1/2001 | Kajita et al. | 430/270.1 |
| 6,225,020 B1 | 5/2001 | Jung et al. | 430/270.1 |
| 6,235,447 B1 | 5/2001 | Lee et al. | 430/270.1 |
| 6,235,448 B1 | 5/2001 | Lee et al. | 430/270.1 |
| 6,541,077 B1 | 4/2003 | Kozawa et al. | 427/503 |
| 6,720,256 B1 | 4/2004 | Wu et al. | 438/638 |
| 7,144,968 B2 | 12/2006 | Kozawa et al. | 528/39 |
| 7,223,525 B2 | 5/2007 | Lipinski | 430/311 |
| 7,655,568 B2 * | 2/2010 | Lee et al. | 438/695 |
| 7,807,336 B2 * | 10/2010 | Lee et al. | 430/314 |
| 2006/0003268 A1 * | 1/2006 | Hong et al. | 430/323 |
| 2007/0148983 A1 * | 6/2007 | Lee et al. | 438/717 |

FOREIGN PATENT DOCUMENTS

| | | |
|---|---|---|
| KR | 10-2005-0002384 | 1/2005 |
| KR | 10-2005-0027133 | 3/2005 |
| KR | 10-0618907 | 8/2006 |
| KR | 10-2007-0070035 | 7/2007 |
| KR | 10-2007-0093177 | 9/2007 |

OTHER PUBLICATIONS

English-language translation of Chinese Office Action for Application No. 200810000431.2, issued Sep. 25, 2009.

* cited by examiner

*Primary Examiner* — Kathleen Duda
(74) *Attorney, Agent, or Firm* — Marshall, Gerstein & Borun LLP

(57) ABSTRACT

A method for forming a fine pattern of a semiconductor device comprises forming a spin-on-carbon layer over an underlying layer, forming an anti-reflection pattern including a silicon containing polymer with a first etching mask pattern, forming a photoresist pattern including a silicon containing polymer with a second etching mask pattern between elements of the first etching mask pattern, and etching the spin-on-carbon layer with the etching mask patterns to reduce the process steps and the manufacturing cost, thereby obtaining a uniform pattern profile.

18 Claims, 7 Drawing Sheets

METHOD FOR FORMING FINE PATTERN OF SEMICONDUCTOR DEVICE

CROSS-REFERENCES TO RELATED APPLICATIONS

The priority benefit of Korean patent application number 10-2007-0065126, filed on Jun. 29, 2007, is hereby claimed and the disclosure thereof is incorporated herein by reference in its entirety.

BACKGROUND OF THE INVENTION

The present invention generally relates to a method for forming a fine pattern of a semiconductor device.

Due to the popularization of information media such as computers, semiconductor device technology has advanced rapidly. Semiconductor devices are required to operate at a high speed and to have a high storage capacity. As a result, manufacturing technology of semiconductor devices is required to manufacture a memory device of high capacity with improved integration, reliability and characteristics for accessing data.

In order to improve integration of the device, photolithography technology has developed to form fine patterns. The photolithography technology includes an exposure technology using chemically amplified Deep Ultra Violet (DUV) light sources such as ArF (193 nm) and VUV (157 nm), and a technology for developing photoresist materials suitable for the exposure light sources.

As a semiconductor device becomes smaller, it is important to control a critical dimension of a pattern line-width in the photolithography technology. Generally, the processing speed of semiconductor devices depends on the critical dimension of the pattern line-width. For example, when the size of the pattern line-width is decreased, the processing speed is increased to improve device performance.

However, it is difficult to form a line and space (L/S) pattern of less than 40 nm by a single exposure process in the photolithography process using an ArF exposer having a common numerical aperture of less than 1.2. Although an exposer having a high numerical aperture with a high index fluid material is used, it is impossible to form L/S pattern of less than 30 nm. When an exposure light source such as extreme ultra violet (EUV) (32 nm) is used in order to form a pattern of less than 30 nm, it is necessary to develop an exposer and resist suitable for the exposure light source, thereby increasing the manufacturing cost.

In order to improve resolution of photolithography technology and extend a process margin, a double patterning technology has been developed. The double patterning technology includes processes whereby a photoresist-coated wafer is respectively exposed by two masks, and then developed, thereby obtaining a complicated pattern, a dense pattern or an isolated pattern.

Since the double patterning technology uses two masks for patterning, the manufacturing cost and the turn-around-time are lower than those of a single patterning technology using a single mask, thereby degrading the throughput. When a pattern having a smaller pitch than a resolution limit of the exposer is formed in the cell region, exposed images are overlapped. As a result, the double patterning technology does not obtain a desired pattern. In alignment, overlays are mis-aligned.

SUMMARY OF THE INVENTION

Various embodiments of the invention are directed at providing a method for forming a fine pattern of a semiconductor device which comprises forming an anti-reflection coating pattern over a spin-on carbon layer; forming a photoresist pattern between the anti-reflection coating patterns; and patterning the spin-on carbon layer using the anti-reflection coating patterns and the photoresist patterns as an etching mask, to simplify process steps using a double patterning method. Preferably the anti-reflection coating composition comprises a silicon-containing polymer and the photoresist composition comprises a silicon-containing polymer.

According to one embodiment of the invention, a method for forming a fine pattern of a semiconductor device comprises forming a spin-on carbon layer over an underlying layer of a semiconductor substrate. An anti-reflection coating film comprising a silicon-containing polymer is formed over the spin-on carbon layer. A first photoresist pattern is formed over the anti-reflection coating film. The anti-reflection coating film is selectively etched with the first photoresist pattern as an etching mask to form an anti-reflection coating pattern until the spin-on carbon layer is selectively exposed. A second photoresist film comprising a silicon-containing polymer is coated over the anti-reflection coating pattern and the exposed the spin-on carbon layer. The second photoresist film is selectively patterned to form the second photoresist pattern elements between the anti-reflection coating patterns. The spin-on-carbon layer is etched with the anti-reflection pattern and the second photoresist pattern as an etching mask. The method may further comprise removing the first photoresist pattern before coating the second photoresist film.

The spin-on-carbon layer can serve as a planarized film formed in a region having a step difference, an anti-reflection film and a mask film by an etching selectivity between lower materials. The spin-on-carbon layer preferably includes a carbon-rich polymer wherein a carbon element is preferably present in an amount ranging from 85 wt % to 90 wt % based on the total molecular weight of the polymer. The spin-on-carbon layer can be coated by a spin-coating method.

The anti-reflection coating film preferably comprises a silicon-containing polymer where a silicon element is preferably present in an amount ranging from 30 wt % to 80 wt %, and preferably 15 wt % to 45 wt %, based on the total weight of the polymer; and the film further comprises an organic solvent; and an additive such as a thermal acid generator and a photoacid generator.

The silicon-containing polymer preferably comprises a compound including —Si—O— unit. Specifically, the silicon-containing polymer is preferably selected from the group consisting of siloxane compounds; silses-quioxane compounds including at least one of hydroxyl phenyl alkyl, alkyl and phenyl as a substituent, and combinations thereof. The organic solvent is preferably selected from the group consisting of ethyl 3-ethoxypropionate, methyl 3-methoxypropionate, cyclohexanone, propyleneglycol methyl ether acetate (PGMEA), 2-heptanone, ethyl lactate, acetyl acetone, and combinations thereof. The organic solvent is preferably present in an amount in a range of about 500 parts by weight to 10,000 parts by weight of 100 parts by weight of the silicon-containing polymer. The additive is preferably present in an amount in a range of about 0.1 parts by weight to 10 parts by weight of 100 parts by weight of the silicon-containing polymer.

The first photoresist pattern preferably is formed by a lithography process, preferably using a general chemically amplified photoresist composition. The chemically amplified photoresist composition preferably includes a photoacid generator, an organic solvent, and a chemically amplified photoresist polymer as a base resin. The chemically amplified photoresist polymer is preferably selected from the group consisting of ROMA-type (ring-opened polymer of maleic anhydride unit) polymers including substituted maleic anhydride as a polymerization repeating unit; COMA-type (cyclo-olefin/maleic anhydride) polymers including cyclo-olefin, maleic anhydride, methacrylate, and acrylate as polymerization repeating units; and hybrid type polymers including combinations thereof.

The process for forming the anti-reflection coating pattern is preferably performed by an etching process employing a source gas comprising $CF_4$, $CHF_3$, $O_2$ and Ar.

The first photoresist film is preferably removed using a thinner to prevent loss of the lower silicon-containing layer.

The exposing and developing process is preferably performed on the second photoresist film to form a second photoresist patterns between the anti-reflection coating patterns. Herein, the second photoresist film preferably has the same thickness (c) as the anti-reflection coating pattern thickness (a) or a greater thickness than that of the anti-reflection coating pattern. In addition, the second photoresist film preferably has the same thickness (c) as the first photoresist film thickness (b) or a smaller thickness than that of the first photoresist film ($a \leq c \leq b$).

The second photoresist film preferably comprises a silicon-containing polymer wherein a silicon element is present preferably in an amount in a range of 30 wt % to 80 wt %, and preferably 15 to 45 wt %, based on the total weight of the polymer; an organic solvent; and a photoacid generator. The silicon-containing polymer preferably comprises a polymerization repeating unit of Formula 1.

[Formula 1]

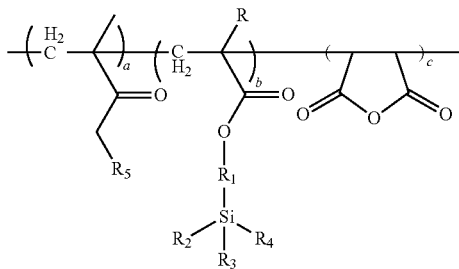

wherein R is hydrogen or methyl; $R_1$ is a linear or branched $C_2$-$C_{10}$ alkylene; $R_2$, $R_3$ and $R_4$ each independently are a $C_1$-$C_3$ alkoxy group; $R_5$ is OH, H, a $C_1$-$C_{10}$ alkyl or an acid labile protecting group; and the relative ratio of a repeating unit number of a:b:c is 0.3-1:1-3:1.

The organic solvent is preferably selected from the group consisting of ethyl 3-ethoxypropionate, methyl 3-methoxypropionate, cyclohexanone, propyleneglycol methyl ether acetate (PGMEA), 2-heptanone, ethyl lactate, acetyl acetone, and combinations thereof. The organic solvent is preferably present in an amount in a range of about 500 parts by weight to 10,000 parts by weight of 100 parts by weight of the silicon-containing polymer. The photoacid generator is preferably present in an amount in a range of about 0.1 parts by weight to 10 parts by weight of 100 parts by weight of the silicon-containing polymer.

The process for forming the spin-on-carbon pattern is preferably performed by an etching process employing a source gas, the source gas comprising $O_2$ and $N_2$, or $O_2$ and $H_2$.

According to one embodiment of the present invention, the method utilizes a spin-on-carbon layer which can be formed by a simple spin coating process instead of an amorphous carbon layer to simplify a process step, thereby reducing a turn-around-time. The spin-on-carbon layer has an absorptivity of '0' in 633 nm regardless of its thickness, and an excellent etching resistance to lower layers in the etching process. In addition, since the spin-on-carbon layer has excellent step coverage, a planarized spin-on-carbon layer can be formed in a region having a step difference.

The silicon element of the silicon-containing polymer, which is included in the second photoresist pattern and the anti-reflection coating pattern, is preferably reacted with the oxygen gas as an etching gas in the etching process, thereby cross-linking the polymers. As a result, the anti-reflection coating pattern and a photoresist pattern have the same etching selectivity as a conventional multi-mask film so that they can be used as a mask for polishing the spin-on carbon layer while the subsequent etching process is performed.

Moreover, the method can decrease the deposition process and the thickness of the multi-mask pattern, thereby reducing the number and complexity of process steps, and the manufacturing cost.

DETAILED DESCRIPTION OF THE SPECIFIC EMBODIMENT

The present invention will be described in detail with reference to the accompanying drawings.

In order to prevent the overlapping and mis-alignment, i) a double exposure etch technology (DEET) and ii) a spacer patterning technology (SPT) are developed, which have been used in a semiconductor device producing process.

The i) DEET comprises forming a first pattern having a line-width twice larger than that of a desired pattern, and forming a second pattern having the same line-width between the first patterns. More specifically, the DEET includes a) a positive method and b) a negative method.

Figure 1:
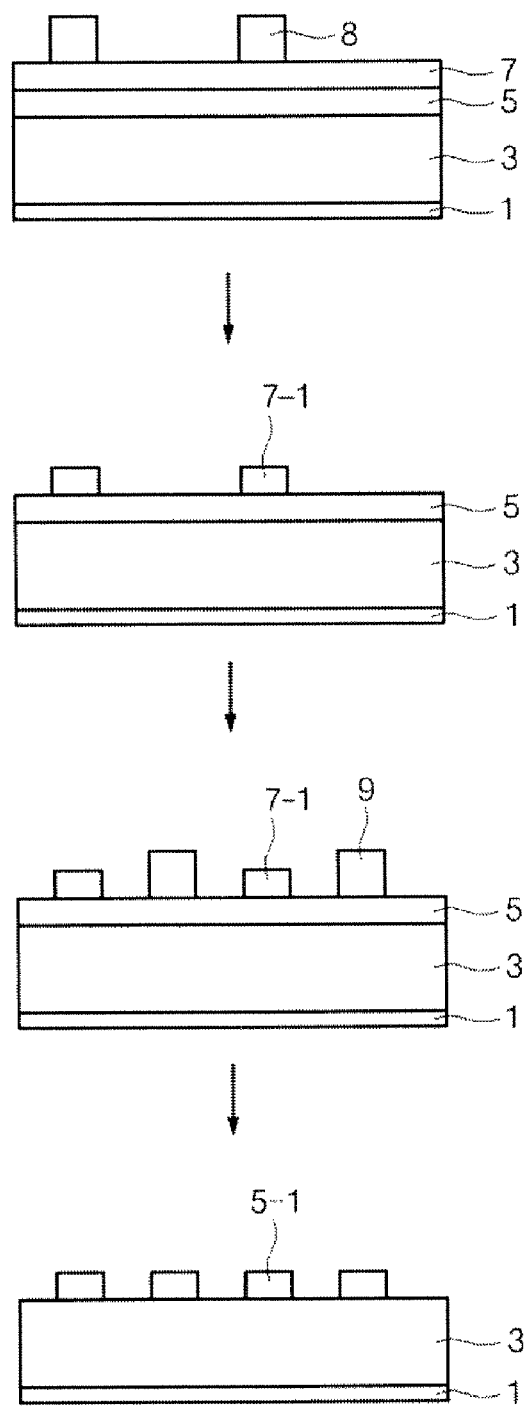
FIG. 1 is a diagram illustrating a conventional positive type double patterning method.

As shown in FIG. 1, in the a) positive method, an underlying layer 3, a first mask film 5, a second mask film 7 and a first positive photoresist pattern 8 are formed over a semiconductor substrate 1. A second mask pattern 7-1 is formed with the first photoresist pattern 8 as an etching barrier mask. A second positive photoresist pattern 9 is formed between the second mask pattern 7-1 elements. A first mask pattern 5-1 is formed with the second mask pattern 7-1 and the second photoresist pattern 9 as an etching barrier mask.

Figure 2:
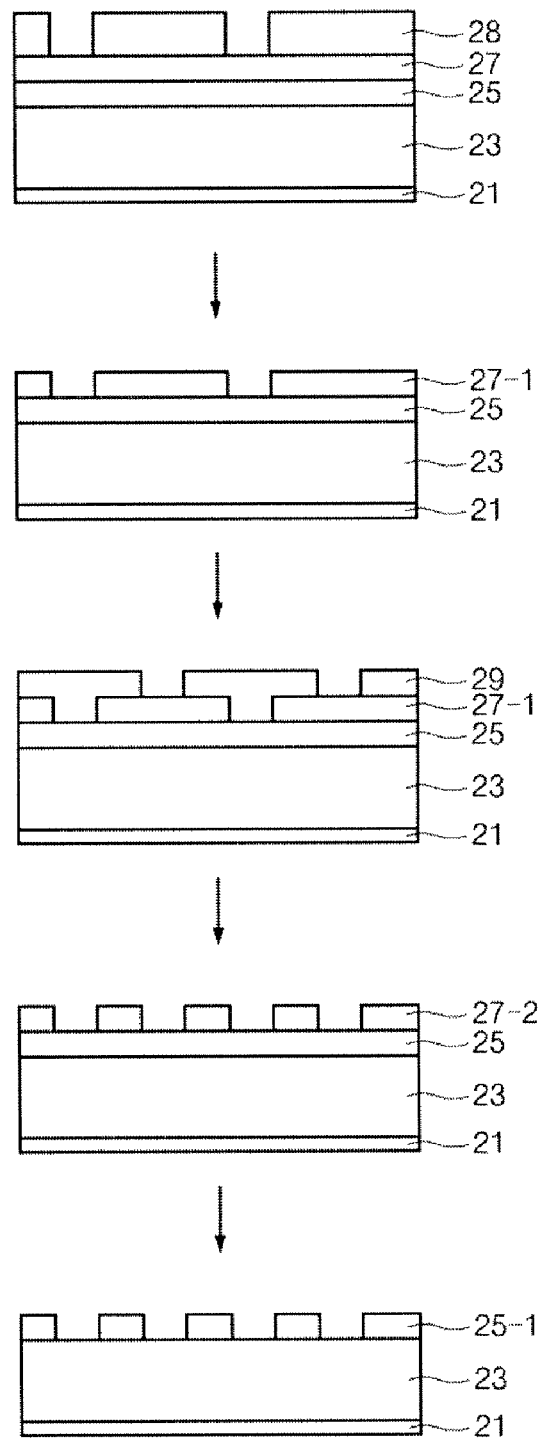
FIG. 2 is a diagram illustrating a conventional negative type double patterning method.

As shown in FIG. 2, in the b) negative method, an underlying layer 23, a first mask film 25, a second mask film 27 and a first negative photoresist pattern 28 are formed over a semiconductor substrate 21. A second mask pattern 27-1 is formed with the first negative photoresist pattern 28 as an etching barrier mask. A second negative photoresist pattern 29 is formed over the second mask pattern 27-1 and the first mask film 25. The second mask pattern 27-1 is etched with the second negative photoresist pattern 29 as an etching barrier mask to form a modified second mask pattern 27-2. The first mask film 25 is etched with the modified second mask pattern 27-2 as an etching barrier mask to form a first mask pattern 25-1.

Since the DEET uses two kinds of masks, it is possible to form a pattern having a desired pitch size. However, the process steps are complicated, and the manufacturing cost is increased. Moreover, when the second photoresist pattern is formed, mis-alignment occurs by inaccuracy in overlay of patterns. Moreover, in the DEET, it is difficult to secure an etching selectivity of the mask pattern such as the photoresist pattern to the lower layer during the etching process.

The ii) SPT is a self-alignment technology to prevent misalignment by performing a mask process for forming a pattern in a cell region. The SPT includes a) a positive method and b) a negative method.

Figure 3:
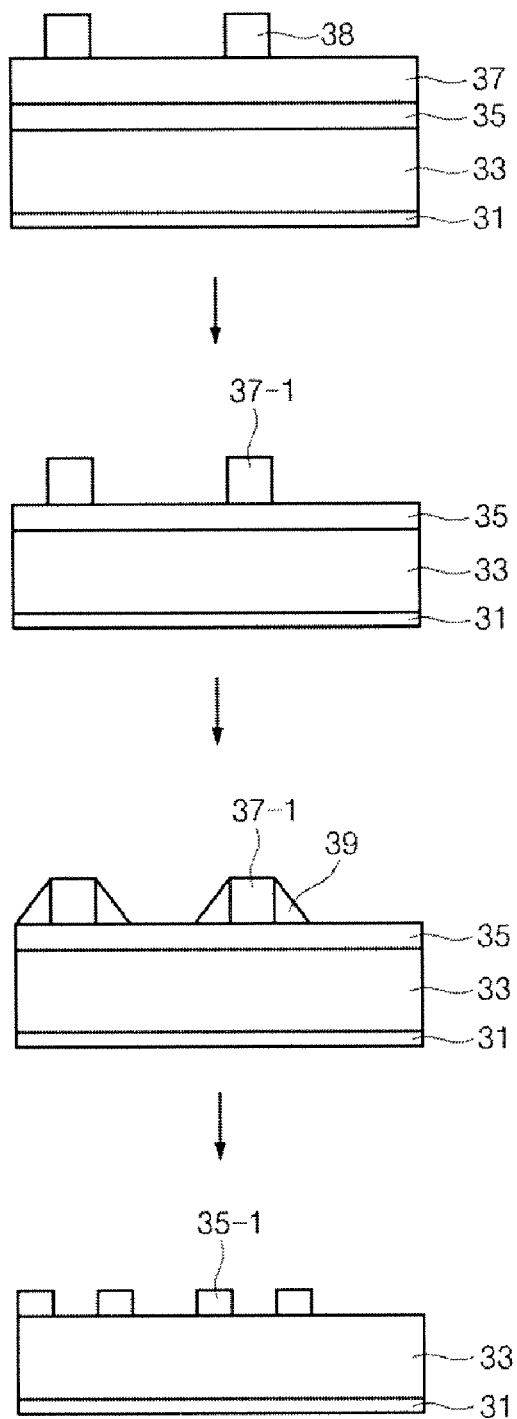
FIG. 3 is a diagram illustrating a conventional positive type spacer patterning method.

As shown in FIG. 3, in the a) positive method, an underlying layer 33, a first mask film 35, a second mask film 37 and a first photoresist pattern 38 are formed over a semiconductor substrate 31. A second mask pattern 37-1 is formed with the first photoresist pattern 38 as an etching barrier mask. A spacer pattern 39 is formed with elements at sidewalls of the second mask pattern 37-1 elements. A first mask pattern 35-1 is formed with the spacer pattern 39 as an etching barrier mask.

Figure 4:
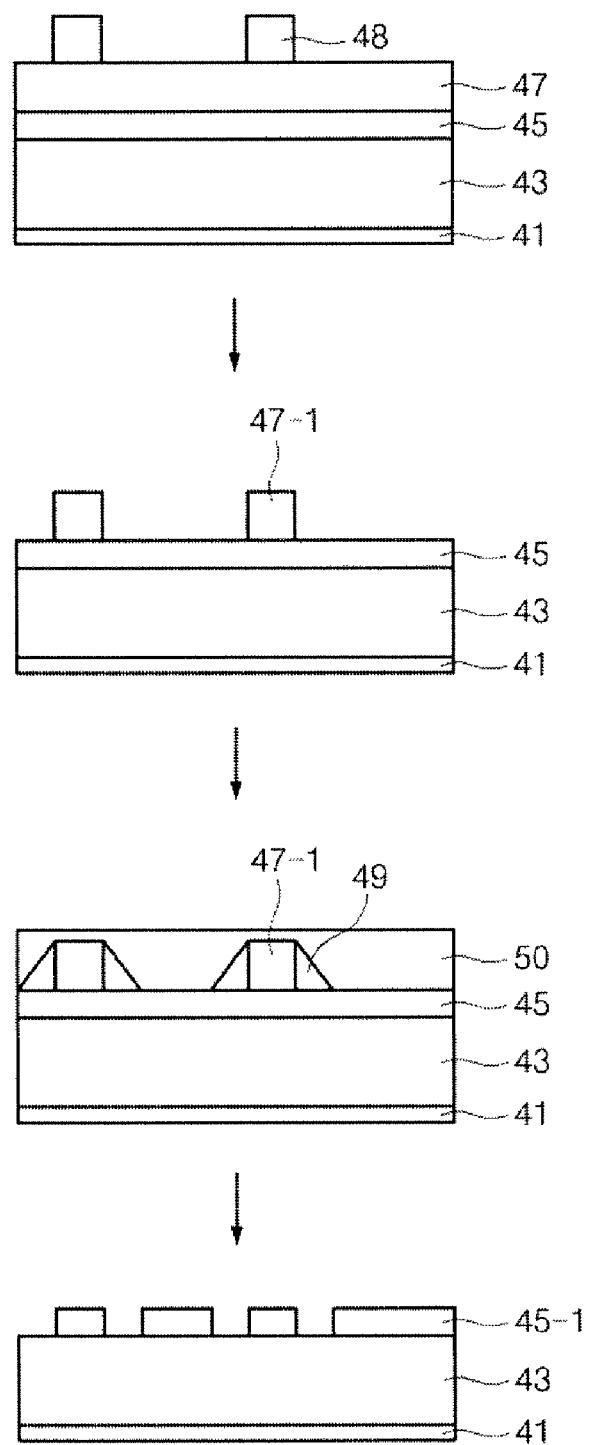
FIG. 4 is a diagram illustrating a conventional negative type spacer patterning method.

As shown in FIG. 4, the b) negative method includes forming an underling layer 43, a first mask film 45, a second mask film 47 and a first photoresist pattern 48 over a semiconductor substrate 41. A second mask pattern 47-1 is formed with the first photoresist pattern 48 as an etching barrier mask. A spacer pattern 49 is formed with elements at sidewalls of the second mask pattern 47-1 elements. A spin-on-glass-film 50 or an anti-reflection film is coated over the resulting structure. A CMP or an etch-back method (not shown) is performed to expose the second mask pattern 47-1. The spacer is removed, and a first mask pattern 45-1 is formed with the resulting second mask pattern 47-1 as an etching barrier mask.

The SPT requires an additional mask process in order to form a pattern in core and peripheral portions or isolate a pattern portion of a mini cell block region. As a result, the process steps are complicated. Also, it is difficult to regulate a line-width of the spacers when the spacer is formed, thereby degrading the uniformity of the pattern line-width.

FIGS. 5a through 5e are cross-sectional diagrams illustrating a method for forming a fine pattern of a semiconductor device using a double patterning method according to an embodiment of the invention.

Figure 5A:
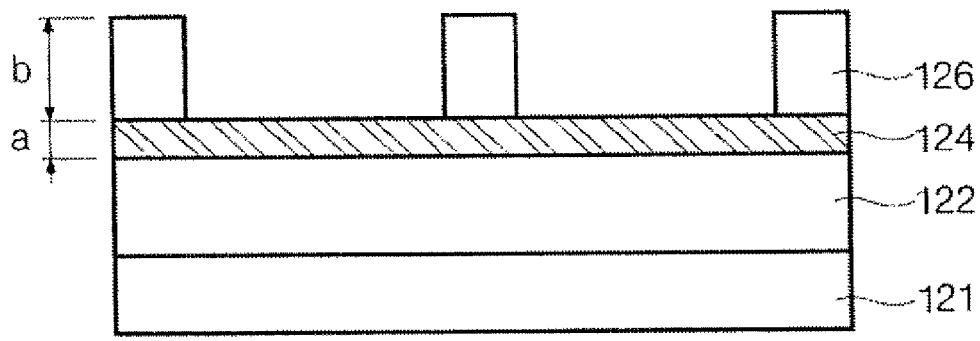
FIGS. 5a through 5e are diagrams illustrating a method for forming a fine pattern of a semiconductor device according to an embodiment of the present invention.

Referring to FIG. 5a, a spin-on-carbon layer 122 is formed over an underlying layer 121 of a semiconductor substrate to have a thickness preferably in a range of about 1,000 Å to about 2,000 Å, highly preferably 1,500 Å.

Any suitable underlying layer can be used. Preferably, the underlying layer preferably may comprise a silicon nitride (SiN) film, a silicon oxide ($SiO_2$) film, a polysilicon layer, or a metal layer. Preferably, the underlying layer is a gate electrode including a gate oxide film/polysilicon layer/tungsten layer/nitride film.

The spin-on-carbon layer includes a carbon-rich polymer wherein a carbon element is preferably present in an amount in a range of 85 wt % to 90 wt % based on the total molecular weight of the polymer. The spin-on-carbon layer can be coated by a simple spin-coating method. In the embodiment, SHN18 (produced by Nissan Chemical Co.) is used.

The spin-on-carbon layer can be formed by a simple spin coating process instead of an amorphous carbon layer to simplify a process step. The spin-on carbon layer serves as a planarized film formed in a region having a step difference, an anti-reflection film and a mask film having an etching selectivity between lower material and the etched layer.

Generally, when an amorphous carbon layer is deposited at high temperature, it absorbs 633 nm wavelength. Therefore, it is impossible to align patterns when the patterns are formed each to have a thickness of more than 3000 Å to obtain an etching selectivity. On the other hand, when the amorphous carbon layer is deposited at low temperature, the layer is formed to have a thickness of more than 6000 Å so that the etching resistance is low. However, the spin-on-carbon layer has an absorptivity of '0' in 633 nm regardless of its thickness, and an excellent etching resistance to lower layers in the etching process.

When a planarized film is formed in a region having a step difference, an amorphous carbon layer has low step coverage so that the amorphous carbon layer is partially stripped in a subsequent $O_2$ ashing process. However, the spin-on-carbon layer is not stripped in a subsequent ashing process due to its excellent step coverage.

An anti-reflection coating composition comprising a silicon-containing polymer is coated over the spin-on-carbon layer 122, and then baked, preferably at a temperature in a range of about 200 to 250° C. for about 90 seconds to form an anti-reflection coating film 124. The anti-reflection coating film 124 has a thickness (a) in a range of about 500 Å to about 1,000 Å.

The anti-reflection coating film preferably comprises a silicon-containing polymer where a silicon element is present in an amount in a range of 30 wt % to 80 wt %, highly preferably 15 wt % to 45 wt %, based on the total weight of the polymer, and the film further comprises an organic solvent and an additive such as a thermal acid generator and a photoacid generator. The silicon-containing polymer preferably comprises a compound including —Si—O— unit. Specifically, the silicon-containing polymer is preferably selected from the group consisting of siloxane compounds, silsesquioxane compounds including hydroxyl phenyl alkyl, an alkyl or phenyl as a substituent, and combinations thereof. In the disclosed embodiment, NCH0987N (produced by Nissan Chemical Co.), HM21 (produced by TOK Co.) and ODL series (produced by Shinetsu Co.) are illustratively used.

The organic solvent is preferably selected from the group consisting of ethyl 3-ethoxypropionate, methyl 3-methoxypropionate, cyclohexanone, propyleneglycol methyl ether acetate (PGMEA), 2-heptanone, ethyl lactate, acetyl acetone, and combinations thereof. The organic solvent is preferably present in an amount in a range of about 500 parts by weight to 10,000 parts by weight of 100 parts by weight of the silicon-containing polymer. The additive is preferably present in an amount ranging from about 0.1 parts by weight to 10 parts by weight of 100 parts by weight of the silicon-containing polymer.

A first photoresist pattern 126 is formed over the anti-reflection film 124, preferably by a lithography process.

Any suitable type of first photoresist pattern can be used, and is preferably formed by lithography process using a general chemically-amplified photoresist composition. Suitable chemically-amplified photoresist compositions are disclosed in U.S. Pat. No. 5,750,680 (May 12, 1998), U.S. Pat. No. 6,051,678 (Apr. 18, 2000), U.S. Pat. No. 6,132,926 (Oct. 17, 2000), U.S. Pat. No. 6,143,463 (Nov. 7, 2000), U.S. Pat. No. 6,150,069 (Nov. 21, 2000), U.S. Pat. No. 6,180,316 B1 (Jan. 30, 2001), U.S. Pat. No. 6,225,020 B1 (May 1, 2001), U.S. Pat. No. 6,235,448 B1 (May 22, 2001) and U.S. Pat. No. 6,235,447 B1 (May 22, 2001), the respective disclosures of which are incorporated by reference herein. Specifically, the chemically-amplified photoresist composition preferably comprises a photoacid generator, an organic solvent, and a chemically-amplified photoresist polymer, preferably comprising a polymer selected from the group consisting of ROMA-type polymers comprising substituted maleic anhydride as a polymerization repeating unit; COMA-type polymers comprising cycloolefin, maleic anhydride, methacrylate and acrylate as polymerization repeating units, and hybrid type polymers comprising combinations thereof as a base resin. The first photoresist pattern 26 preferably has a thickness (b) in a range of about 1,200 Å to about 3,000 Å.

In the disclosed embodiment, AIM5076 (produced by Japan Synthetic Rubber (JSR) Co.) is coated on the anti-reflection coating film 124, and exposed and developed to form the first photoresist pattern 126 at 1,500 Å. The exposure process is illustratively performed with a 1700i ArF immersion scanner (produced by ASML Holding Co.). The exposure process is preferably performed with KrF or EUV as well as ArF as exposure light sources.

Figure 5B:
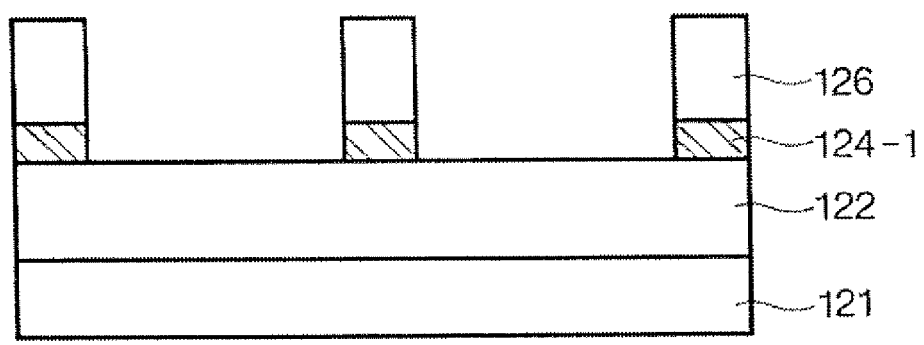

Referring to FIG. 5b, the anti-reflection film 124 is patterned with the first photoresist pattern 126 as an etching mask to form an anti-reflection pattern 124-1.

The patterning process is preferably performed by etching process employing a source gas comprising $CF_4$ (90 sccm), $CHF_3$ (30 sccm), $O_2$ (11 sccm), and Ar (600 sccm) under a pressure (160 mT) and a power (150 W) in a FLEX etching chamber (produced by Lam Co.).

In the patterning process, an oxygen plasma gas is first injected to form a $SiO_2$ film over the lower anti-reflection film, thereby increasing an etching selectivity of the anti-reflection film to the first photoresist pattern.

The first photoresist pattern 126 is removed, preferably with a thinner to prevent loss of the lower the spin-on-carbon layer 122. When the first photoresist film is removed by an ashing process, the surface of the lower spin-on-carbon layer 122 may be damaged.

Figure 5C:
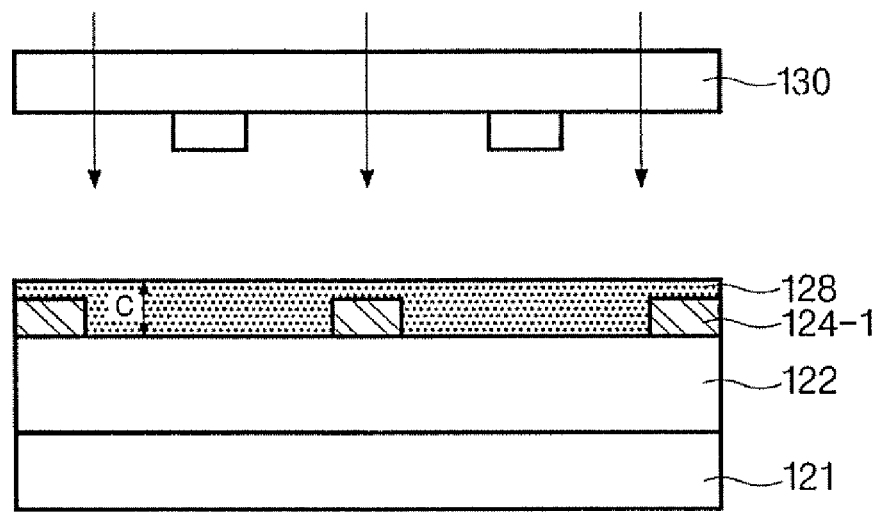
Figure 5D:
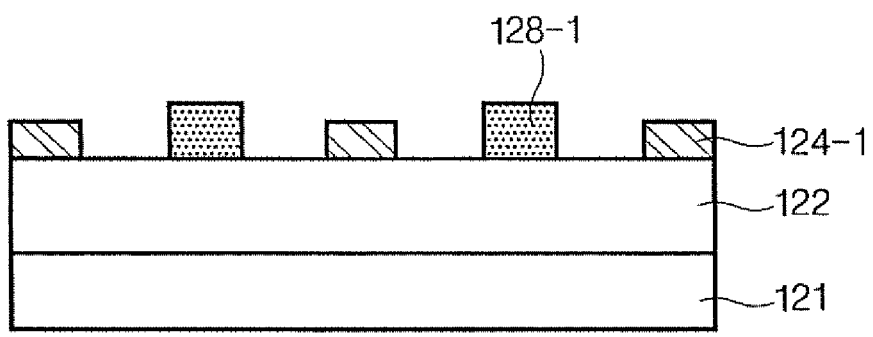

Referring to FIG. 5c, a second photoresist composition is coated over the exposed spin-on-carbon layer and the anti-reflection coating pattern 124-1, and then baked, preferably at a temperature in a range of about 120° C. to about 180° C. for about 90 seconds to form a second photoresist film 128. The second photoresist film 128 preferably has a thickness (c) in a range from about 500 Å to about 1,500 Å, highly preferably 1,000 Å.

The second photoresist film 128 preferably has the same thickness (c) as the thickness (a) of the anti-reflection coating pattern 124-1 or a greater thickness than that of the anti-reflection coating pattern 124-1. In addition, the second photoresist film 128 preferably has the same thickness (c) as the thickness (b) of the first photoresist film pattern 126 or a smaller thickness than that of the first photoresist film pattern 126 ($a \leq c \leq b$).

The second photoresist film 128 composition preferably comprises a silicon-containing polymer wherein a silicon element is preferably present in an amount in a range of 30 wt % to 80 wt %, highly preferably 15 wt % to 45 wt %, based on the total weight of the polymer; a photoacid generator, and an organic solvent. Any suitable silicon-containing polymer can be used. For example, silicon-containing polymers disclosed in Korean Patent Publication No. 10-2005-002384, U.S. Pat. No. 6,541,077 (Apr. 1, 2003) and U.S. Pat. No. 7,144,968 (Dec. 5, 2006), the respective disclosures of which are incorporated by reference herein, may be used. Preferably, the silicon-containing polymer includes a polymerization repeating unit of Formula 1. In the embodiment, SHB-A629 (produced by Shinetsu Co.) or SAX-100K (produced by JSR Co.) is used.

[Formula 1]

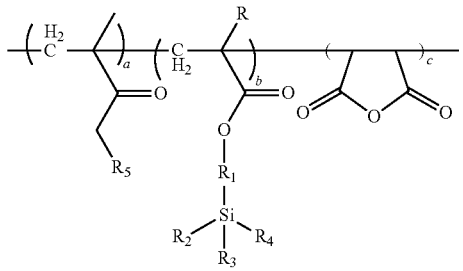

wherein R is hydrogen or methyl; $R_1$ is a linear or branched $C_2$-$C_{10}$ alkylene; $R_2$, $R_3$ and $R_4$ are each independently a $C_1$-$C_3$ alkoxy group; $R_5$ is OH, H, a $C_1$-$C_{10}$ alkyl or an acid labile protecting group; and the relative ratio of repeating unit number of a:b:c is 0.3-1:1-3:1.

The organic solvent is preferably selected from the group consisting of ethyl 3-ethoxypropionate, methyl 3-methoxypropionate, cyclohexanone, propyleneglycol methyl ether acetate (PGMEA), 2-heptanone, ethyl lactate, acetyl acetone, and combinations thereof. The organic solvent is preferably present in an amount in a range of about 500 parts by weight to 10,000 parts by weight of 100 parts by weight of the silicon-containing polymer. The photoacid generator is preferably present in an amount in a range of about 0.1 parts by weight to 10 parts by weight of 100 parts by weight of the silicon-containing polymer.

The second photoresist film 128 is exposed with an exposure mask 130 and developed. As a result, a second photoresist pattern 128-1 is formed with elements between the anti-reflection coating patterns 124-1 as shown FIG. 5d.

The exposure process is preferably performed with a 1700i ArF immersion scanner (produced by ASML Holding Co.). The developing process is preferably performed with 2.38 wt % tetramethyl ammonium hydroxide (TMAH) aqueous solution. The exposure process can be performed with KrF or EUV as well as ArF.

The anti-reflection pattern 124-1 including the silicon containing polymer is not exposed in the exposing process to form the second photoresist pattern 128-1, thereby remaining as an initial pattern shape after the developing process.

Figure 5E:
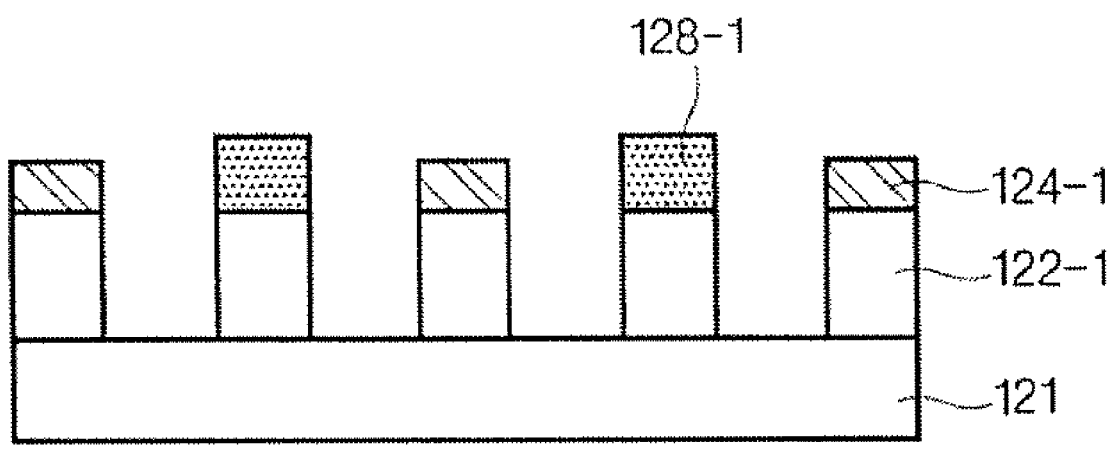

Referring to FIG. 5e, the spin-on-carbon layer 122 is patterned with the second photoresist pattern 128-1 and the anti-reflection pattern 124-1 to form a spin-on-carbon layer pattern 122-1.

The patterning process preferably is performed in a FLEX etching chamber (produced by Lam Co.) under a pressure (160 mT) and a power (150 W) with a plasma etching gas having a flow ratio of $O_2:N_2=1:1-3:2$, or of $O_2:H_2=5:2$.

The silicon element of the silicon-containing polymer which is included in the second photoresist pattern and the anti-reflection coating pattern is reacted with the oxygen gas as an etching gas in the etching process, thereby cross-linking the polymers. As a result, the second photoresist pattern and the anti-reflection coating pattern have an etching selectivity so that they can be used as a mask for polishing an underlying layer while the etching process is performed.

In the patterning process, the anti-reflection pattern 124-1 and the second photoresist pattern 128-1 including a silicon containing polymer used as an etching mask serve as a conventional mask film as an etching mask to obtain a uniform pattern profile.

There is provided a semiconductor device manufactured according to the method.

As described above, according to the disclosed embodiment of the invention, a method for forming a fine pattern of a semiconductor device includes forming the anti-reflection coating pattern and the second photoresist pattern comprising a silicon-containing polymer instead of forming a multi mask film over an underlying layer. The anti-reflection coating pattern and a photoresist pattern have the same etching selectivity ratio as a conventional multi mask film. Therefore, the method simplifies the process steps and reduces the manufacturing cost.

Moreover, the two kinds of the pattern that have a similar structure can be used as a pattern for transcribing a circuit image in a lithography process to obtain a uniform pattern profile. Also, the invention provides a semiconductor device fabricated by the method for forming a fine pattern of a semiconductor device.

The described embodiments of the invention are illustrative and not limiting. Various alternatives and equivalents are possible. The invention is not limited by the lithography steps described herein, nor is the invention limited to any specific type of semiconductor device. For example, the invention may be implemented in a dynamic random access memory (DRAM) device or non-volatile memory device. Other additions, subtractions, or modifications are intended to fall within the scope of the appended claims.

What is claimed is:

1. A method for forming a fine pattern of a semiconductor device, comprising:
    forming a spin-on-carbon layer over an underlying layer of a semiconductor substrate;
    forming an anti-reflection film including a silicon containing polymer over the spin-on-carbon layer:
    forming a first photoresist pattern over the anti-reflection film;
    selectively patterning the anti-reflection film using the first photoresist pattern as an etching mask to form an anti-reflection pattern exposing the spin-on-carbon layer;
    forming a second photoresist film including a silicon containing polymer over the anti-reflection pattern;
    selectively patterning the second photoresist film to form a second photoresist pattern between the anti-reflection patterns; and
    etching the spin-on-carbon layer using the anti-reflection patterns and the second photoresist patterns as an etching mask.

2. The method according to claim 1, wherein the spin-on-carbon layer comprises a carbon-rich polymer wherein a carbon element is present in an amount in a range of 85 wt % to 90 wt % based on the total molecular weight of the polymer.

3. The method according to claim 1, wherein the anti-reflection coating film comprises: a silicon-containing polymer wherein a silicon element is present in an amount in a range of 30 wt % to 80 wt % based on the total weight of the polymer; an organic solvent; and an additive selected from the group consisting of thermal acid generators and photoacid generators.

4. The method according to claim 3, wherein the silicon-containing polymer is selected from the group consisting of siloxane compounds, silsesquioxane compounds comprising at least one of hydroxyl phenyl alkyl, alkyl, and phenyl as a substituent, and combinations thereof.

5. The method according to claim 3, wherein the organic solvent is selected from the group consisting of ethyl 3-ethoxypropionate, methyl 3-methoxypropionate, cyclohexanone, propyleneglycol methyl ether acetate (PGMEA), 2-heptanone, ethyl lactate, acetyl acetone, and combinations thereof.

6. The method according to claim 3, wherein the organic solvent is present in an amount in a range of about 500 parts by weight to 10,000 parts by weight of 100 parts by weight of the silicon-containing polymer; and
    the additive is present in an amount ranging from about 0.1 to 10 parts by weight of 100 parts by weight of the silicon-containing polymer.

7. The method according to claim 1, wherein the first photoresist patterns are formed using a chemically amplified photoresist composition.

8. The method according to claim 1, wherein the chemically amplified photoresist composition comprises a photoacid generator, an organic solvent, and a chemically-amplified photoresist polymer as a base resin.

9. The method according to claim 1, wherein the anti-reflection coating film is patterned by a dry etching process employing a source gas comprising $CF_4$, $CHF_3$, $O_2$ and Ar.

10. The method according to claim 1, further comprising removing the first photoresist pattern before forming the second photoresist film.

11. The method according to claim 10, comprising removing the first photoresist pattern by using a thinner.

12. The method according to claim 1, wherein the second photoresist film has the thickness as same as or greater than the anti-reflection coating pattern; and
    the second photoresist film has a thickness as same as or less than the first photoresist pattern thickness.

13. The method according to claim 1, wherein the second photoresist film comprises: a silicon-containing polymer wherein a silicon element is present in an amount in a range of 30 wt % to 80 wt % based on the total weight of the polymer; an organic solvent; and a photoacid generator.

14. The method according to claim 13, wherein the silicon containing polymer includes a polymerization repeating unit of Formula 1:

[Formula 1]

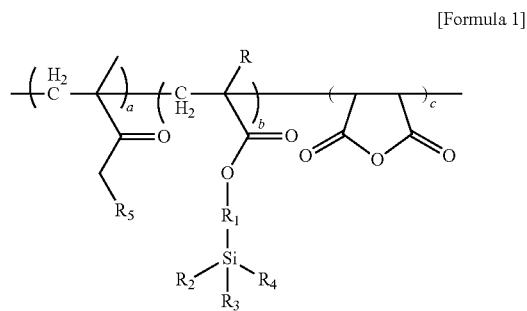

wherein R is hydrogen or methyl; $R_1$ is a linear or branched $C_2$-$C_{10}$ alkylene; $R_2$, $R_3$ and $R_4$ each independently are a $C_1$-$C_3$ alkoxy group; $R_5$ is selected from the group consisting of OH, H, a $C_1$-$C_{10}$ alkyl and an acid labile protecting group; and the relative ratio of the repeating unit number of a:b:c is 0.3-1:1-3:1.

15. The method according to claim 13, wherein the organic solvent is selected from the group consisting of ethyl 3-ethoxypropionate, methyl 3-methoxypropionate, cyclohexanone, propyleneglycol methyl ether acetate (PGMEA), 2-heptanone, ethyl lactate, acetyl acetone and combinations thereof.

16. The method according to claim 13, wherein the organic solvent is present in an amount ranging from about 500 parts by weight to 10,000 parts by weight of 100 parts by weight of the silicon-containing polymer; and
    the photoacid generator is present in an amount ranging from about 0.1 parts by weight to 10 parts by weight of 100 parts by weight of the silicon-containing polymer.

17. The method according to claim 1, wherein the spin-on-carbon layer is etched by an etching process employing a source gas comprising: (i) $O_2$ and (ii) at least one of $N_2$, and $H_2$.

18. The method according to claim 1, wherein the patterning the second photoresist film is performed by an ArF, KrF or EUV lithography process.

* * * * *